United States Patent
Chen (10) Patent No.: US 11,296,723 B2
(45) Date of Patent: Apr. 5, 2022

(54) METHODS AND APPARATUSES FOR DATA PROCESSING IN COMMUNICATION SYSTEM

(71) Applicant: Alcatel Lucent, Nozay (FR)

(72) Inventor: Yu Chen, Shanghai (CN)

(73) Assignee: Alcatel Lucent, Nozay (FR)

( * ) Notice: Subject to any disclaimer, the term of this patent is extended or adjusted under 35 U.S.C. 154(b) by 350 days.

(21) Appl. No.: 16/476,610

(22) PCT Filed: Jan. 3, 2018

(86) PCT No.: PCT/IB2018/000062
§ 371 (c)(1),
(2) Date: Jul. 9, 2019

(87) PCT Pub. No.: WO2018/127788
PCT Pub. Date: Jul. 12, 2018

(65) Prior Publication Data
US 2019/0372591 A1    Dec. 5, 2019

(30) Foreign Application Priority Data
Jan. 9, 2017    (CN) .................. 201710014771.X (51) Int. Cl.
*H03M 13/00*    (2006.01)
*H03M 13/09*    (2006.01)
(Continued)

(52) U.S. Cl.
CPC ....... *H03M 13/09* (2013.01); *H03M 13/1108* (2013.01); *H03M 13/1148* (2013.01); *H03M 13/13* (2013.01); *H04L 1/0061* (2013.01)

(58) Field of Classification Search
CPC ............. H03M 13/09; H03M 13/1108; H03M 13/1148; H03M 13/13; H04L 1/0061
See application file for complete search history.

(56) References Cited

U.S. PATENT DOCUMENTS 10,103,752 B2 * 10/2018 Li .................. H04L 1/0061
10,581,462 B2 * 3/2020 Ge .................. H04L 9/3226
(Continued)

FOREIGN PATENT DOCUMENTS

| CN | 103780329 A | 5/2014 |
| CN | 105680883 A | 6/2016 |
| CN | 106209113 A | 12/2016 |

OTHER PUBLICATIONS

Tao Wang et al., "Parity-Check-Concatenated Polar Codes," IEEE Communications Letter, IEEE Service Center, vol. 20, No. 12, XP011636292, pp. 2342-2345, Dec. 2016.
(Continued)

*Primary Examiner* — Esaw T Abraham
(74) *Attorney, Agent, or Firm* — Fay Sharpe LLP (57) ABSTRACT

Embodiments of the present disclosure provide methods and apparatuses for data processing in a communication system. For example, the method comprises: generating, based on an intended performance, an error detection code to be used; distributing bits of the error detection code in information bits to be coded; and perform polar encoding on the information bits together with the error detection code distributed in the information bits. The embodiments of the present disclosure also provide a communication device capable of implementing the method.

13 Claims, 6 Drawing Sheets

(51) Int. Cl.
*H03M 13/11* (2006.01)
*H03M 13/13* (2006.01)
*H04L 1/00* (2006.01)

(56) References Cited

U.S. PATENT DOCUMENTS

| | | | |
|---|---|---|---|
| 2014/0173376 A1* | 6/2014 | Jeong | H04L 1/0041 |
| | | | 714/755 |
| 2017/0257186 A1* | 9/2017 | Ge | H03M 13/13 |
| 2018/0375532 A1* | 12/2018 | Ge | H04L 9/3226 |

OTHER PUBLICATIONS

Huayi Zhou et al., "Segmented CRC-Aided SC List Polar Decoding," 2016 IEEE 83$^{rd}$ Vehicular Technology Conference, XP032918751, pp. 1-5, 2016.
Nokia et al., "Polar Codes Design for UL Control," 3$^{rd}$ Generation Partnership Project (3GPP), 3GPP TSG-RAN WG1#NR Ad Hoc Meeting , R1-1701033, XP051202347, 5 pages, Spokane, US, Jan. 16-20, 2017.
International Search Report for PCT/IB2018/000062 dated May 15, 2018.

\* cited by examiner

METHODS AND APPARATUSES FOR DATA PROCESSING IN COMMUNICATION SYSTEM

FIELD

Embodiments of the present disclosure generally relate to a communication system, and more specifically, to a method and apparatus for data processing at a transmitting device and a receiving device in a communication system.

BACKGROUND

Polar code has been proposed for the enhanced mobile broadband (eMBB) control channel. The polar code is also a candidate of channel coding for machine type communication (mMTC). As compared to other channel coding solutions, polar coding has advantages, such as low complexity and capacity achieving. Therefore, for example in a fifth generation (5G) mobile communication system, polar coding will play an important role.

Regarding polar code, the often used decoding solution includes a list based solution or a cyclic redundant check (CRC) aided list solution. A list is a characterization of a decoding path. That is, for the solution in which the list has a size of L, L branches are to be retained in decoding. In order to obtain satisfactory performances, a list of a large size is required, for example, L=32. However, the complexity of the polar code may be modeled as a function of L, namely $L*\log_2 N$, where N is the size of an unpunctured codeword and L is the list size. It can be seen from the complexity modeling that the complexity of polar code increases in proportion to the list size. Moreover, storage space consumed in a decoding process may also be determined by the list size.

Therefore, though a large list size can provide a good decoding performance, such as a low block error rate (BLER), it consumes more storage space and has an increased decoding complexity, resulting higher power consumption and longer decoding latency. This is a disadvantage for certain receiving devices, especially for an mMTC terminal. A parity check-based solution (PC-Polar) has been proposed, which has lower complexity than a traditional CRC-aided list solution. However, PC-Polar is still not optimal, for example, it has a high false alarm rate (FAR) and its performance is not sufficiently optimized. In addition, code construction and check bits of the PC-Polar are not very efficient, because it cannot protect the information bits.

SUMMARY

A brief summary of various embodiments will be given below to provide basic understanding on some aspects of various embodiments. It should be noted that this Summary is not intended to identify essential points of key elements or describe the scope of various embodiments. The sole purpose is to present some concepts in a simplified manner to acts as a preamble of the following detailed description.

In a first aspect of the present disclosure, there is provided a method of data processing in a communication system. The method comprises: generating, based on an intended performance, an error detection code to be used; distributing bits of the error detection code in information bits to be encoded; and performing polar encoding on the information bits together with the error detection code distributed in the information bits.

In a second aspect of the present disclosure, there is provided a data processing method in a communication system. The method comprises: obtaining location information related with an error detection code to be used in polar encoding; performing, based on the location information, polar decoding on received polar-encoded data to obtain output bits; obtaining information bits from the output bits; and extracting the error detection code from the output bits to check the information bits.

In a third aspect of the present disclosure, there is provided a communication device. The communication device includes: a processor; and a memory storing instructions, the instructions, when executed by the processor, causing the communication device to: generate, based on an intended performance, an error detection code to be used; distribute bits of the error detection code in information bits to be encoded; and perform polar encoding on the information bits together with the error detection code distributed in the information bits.

In a fourth aspect of the present disclosure, there is provided a communication device. The communication device includes: a processor; and a memory storing instructions, the instructions, when executed by the processor, causing the communication device to: obtain location information related with an error detection code to be used in polar encoding; perform, based on the location information, the polar encoding on received polar-encoded data to obtain output bits; obtain information bits from the output bits; and extract the error detection code from the output bits to check the information bits.

Through the description below, it would be appreciated that, in accordance with embodiments of the present disclosure, the communication device can obtain the desired decoding performance with lower complexity, and provide a better error detection capability in the meantime.

It would be appreciated that the contents as described in this Summary is not intended to identify key features or essential features of the embodiments of the present disclosure, nor is it intended to be used to limit the scope of the claimed subject matter. Other features of the present disclosure will be made apparent by the following description.

BRIEF DESCRIPTION OF THE DRAWINGS

Through the contents disclosed below and the claims, the objectives, advantages, and other features of the present disclosure will become more apparent. Only taken as examples herein, non-limiting description of the preferred embodiments will be given with reference to the drawings in which:

Throughout the drawings, the same or similar reference numerals represent the same or similar element.

DETAILED DESCRIPTION OF EMBODIMENTS

In the following, details are illustrated for the purpose of clarification. However, those skilled in the art would realize that the present disclosure can be implemented without these specific details. Therefore, the present invention is not meant to be confined to the embodiments as shown, but should be endowed with the broadest scope conforming to the principles and features as described herein.

It would be appreciated that terms such as "first" and "second" are only used to differentiate one element from another. As a matter of fact, a first element may be called a second element, or vice versa. Besides, it would be understood that "include" and "comprise" are only used to demonstrate the presence of a feature, an element, a function, or a component as described herein, without excluding the presence of one or more other features, elements, functions, or components.

For ease of explanation, in this context, some embodiments of the present disclosure will be introduced with wireless communications, such as cellular communications, as the background, and terms in Long Term Evolution/Long Term Evolution—Advanced (LTE/LTE-A) formulated by 3GPP or in 5G are employed. However, those skilled in the art would appreciate that embodiments of the present invention are not limited to wireless communication systems conforming to wireless communication protocols formulated by 3GPP, but may be applicable to any communication system containing a similar issue, such as WLAN, a wired communication system, or other communication systems to be developed in the future.

Likewise, the terminal device in the present disclosure may be a user equipment (UE), or any terminal having a wired or wireless communication function, including, but not limited to, a mobile phone, a computer, a personal digital assistant, a game machine, a wearable device, a on-vehicle communication device, a Machine Type Communication (MTC) device, a Device-to-Device (D2D) communication device, a sensor and so on. The term "a terminal device" can be used interchangeably with a UE, a mobile station, a subscriber station, a mobile terminal, a user terminal, or a wireless device. In addition, the network device may be a network node, such as a node B (Node B or NB), a base transceiver station (BTS), a base station (BS), or a base station system (BSS), a relay, remote wireless front (RRF), an access node (AN), an access point (AP), etc.

Figure 1A:
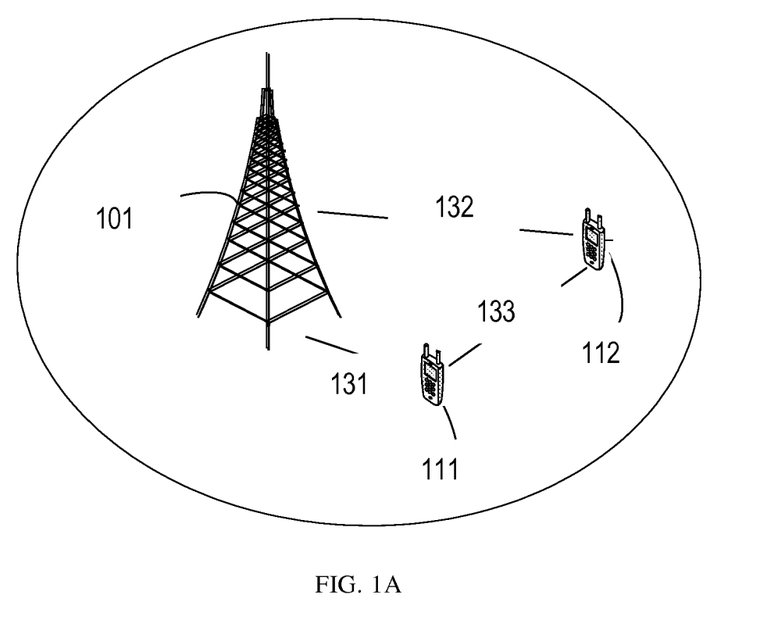
FIG. 1 is a diagram illustrating an example communication system 100 in which a method in accordance with embodiments of the present disclosure can be implemented.

FIG. 1A is a diagram illustrating an example wireless communication system 100 in which a method in accordance with embodiments of the present disclosure can be implemented. The wireless communication system 100 may include one or more network devices 101. For example, in the wireless communication system 100, the network device 101 may be embodied as a base station, such as an evolved node B (eNodeB or eNB). It would be appreciated that the network device 101 may be embodied in other manners, such as a node B, a basic transceiver station (BTS), a base station (BS), or a base station sub-system (BSS), a relay and so on. The network device 101 provides a wireless connection to a plurality of terminal devices 111-112 within the coverage thereof. The terminal devices 111 and 112 may communicate with a network device via a wireless transmission channel 131 or 132, and/or may communicate with each other via a wireless transmission channel 133.

Figure 1B:
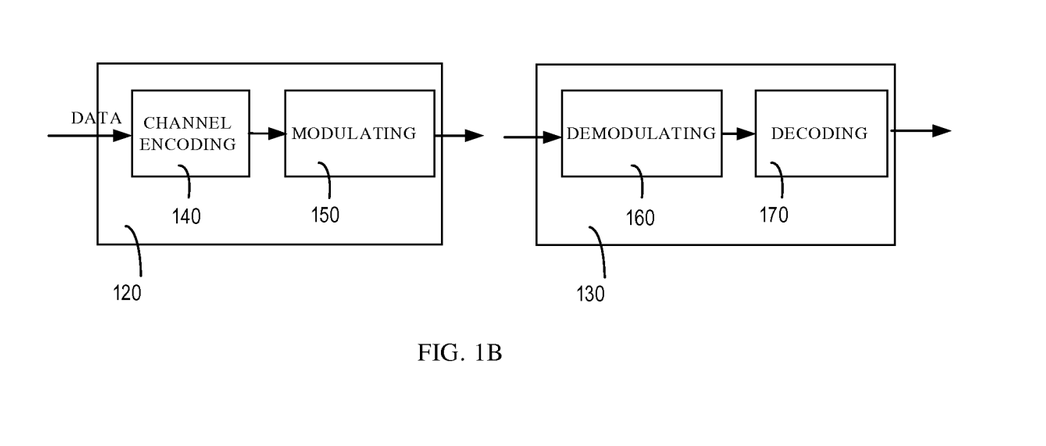

FIG. 1B is a simplified diagram illustrating processing implemented at a transmitting device 120 and a receiving device 130 in communication. The network device 101 or the terminal devices 111 and 112 in FIG. 1 may act as the transmitting device 120 and/or the receiving device 130.

As shown in FIG. 1B, in order to ensure reliable transmission of data (including control signaling), a transmitting device performs channel coding (140) on the data to be transmitted to introduce redundancy, thereby resisting distortion probably introduced in a transmission channel (for example, 131, 132, and 133 in FIG. 1A). Alternatively, the channel-coded data may be further channel interleaved (not shown) and/or modulated (150) before being transmitted. At a receiving device, a process reverse to that of the transmitting device is performed. That is, the received signal is demodulated (160), de-interleaved (not shown) and decoded (170) to recover the transmitted data. In some embodiments, other or different processing may be involved at the transmitting device, and the receiving device may perform a reverse operation accordingly.

In the embodiments of the present disclosure, polar code is used in the channel encoding processing 140 in FIG. 1B. For polar code with a code length N (for example, $N=2^n$), assuming that its code rate is K/N, K=[1, N] information bits can be transmitted. Apart from the K information bits, N-K bits are redundant bits configured with fixed values (for example, 0 or any other appropriate values), which are referred to as frozen bits. The values of frozen bits are considered as being known, and therefore are represented by known values or a probability corresponding to the known value (for example, a specific value of a log likelihood ratio (LLR)) during decoding).

The polar coding implements polarization of the channel by two steps, namely channel combination and channel splitting. It should be note that the channel herein is a coding channel, namely a channel involved in the coding process from an input to an output, rather than the transmission channels 131-133 in FIG. 1A. A channel allowing each channel bit to pass there through may be called a sub-channel. Different split sub-channels have different channel transfer probabilities. Due to the presence of a channel transfer characteristic, for the polar encoding, if an error occurs to a certain bit decoded previously, it may affect the following bit decoding, thus resulting in error spread.

At the modulation processing 150 in FIG. 1B, any modulation technique known or to be developed in the future may be used, such as BPSK, QPSK, 64QAM. The embodiments of the present disclosure are not limited to any specific modulating manner. It would be appreciated that, in modulation 160 of the receiving device 130, a de-modulating manner will be varied in accordance to the modulating manner. As those skilled in the art would appreciate, the receiving device may use, alternatively or in addition, processing other than de-modulation, based on different processing used by the transmitting device.

In some embodiments of the present disclosure, the decoding 170 as shown in FIG. 1B may use, for example but is not limited to, a list-based decoding method, or a method based on a sequence cancellation (SC), or any decoding method known or to be developed in the future.

In order to improve the decoding performance, to reduce FAR, and to provide a better error detecting capability, the embodiments of the present disclosure provide methods and apparatuses for improving coding and decoding. Now referring to FIGS. 2 and 3, the example methods in accordance with the embodiments of the present disclosure are described. For ease of discussion, the description about FIGS. 2 and 3 will be made with reference to the environment as shown in FIG. 1A.

Figure 2:
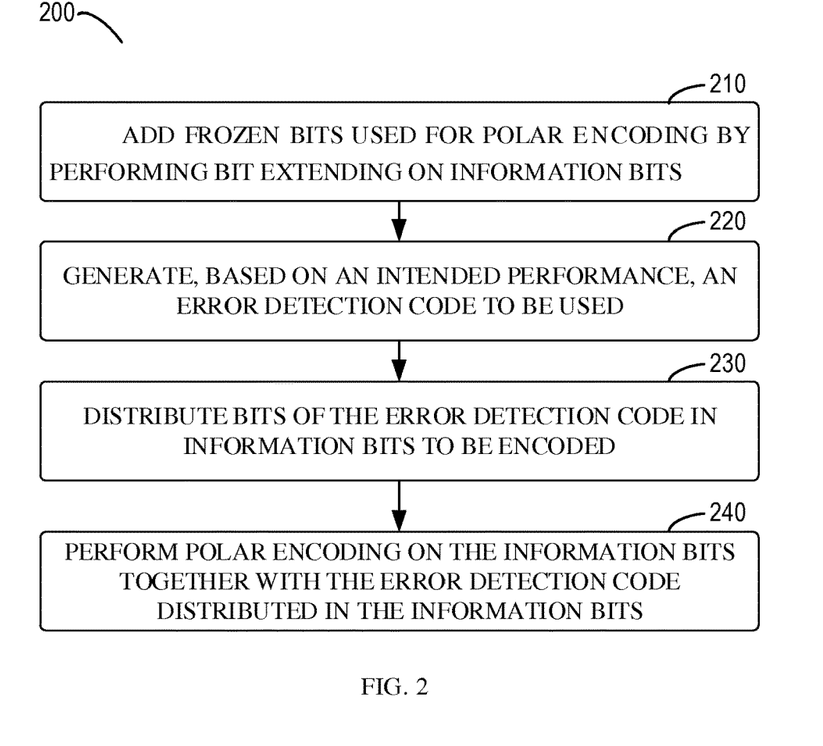
FIG. 2 is a flowchart of a method 200 implemented at a communication device acting as a transmitting apparatus in accordance with embodiments of the present disclosure.

FIG. 2 is a flowchart illustrating a method 200 in accordance with the embodiments of the present disclosure. The method 200 is implemented at a communication device acting as the transmitting device in the communication network 100. For example, the communication device may be the terminal devices 111, 112, or the network device 101 in FIG. 1. For ease of description, the method 200 will be described with reference to the network device 101 in FIG. 1. It would be appreciated that the method 200 may also include additional steps not shown and/or may skip over the shown steps, and the scope of the present disclosure is not limited in this regard.

As shown in FIG. 2, in block 210, the network device 101 adds frozen bits used for polar encoding by performing bit extending on the information bits to be coded. As described in the foregoing, the frozen bits may be configured to be a fixed value. For sake of simplification, the frozen bits may be configured as 0 in the description below. However, it would be appreciated that the frozen bits may also be configured as other fixed values, and the scope of the present disclosure is not limited in this regard. In some embodiments, any method known or to be developed in the future may be used for bit extension, so as to add the frozen bits for polar encoding to the information bits to be encoded.

Besides, it would be appreciated that it is not necessary to add the frozen bits for polar encoding to the information bits to be encoded. In an alternative embodiment, the polar code which has not been bit extended may be used. That is, the block 210 may be skipped over in some embodiments.

In block 220, the network device 101 generates, based on an intended performance, an error detection code to be used. In some embodiments, the error detection code may include linear grouping code, such as a CRC code, a BCH code, a Hamming code, or a Gray code. For the purpose of description, in the following description, the CRC code acts as an example of the error detection code. However, it should be appreciated that other types of the error detection code may also be applied, such as parity check code, the error detection code generated based on a Hash function and so on. The scope of the present disclosure is not limited in this aspect.

The performance as described herein is for example a decoding performance of the polar code. In some embodiments, for example in a CRC-aided list decoding solution, the network device 101 may determine a number of information bits to be used based on a size of the used list. Besides, in some embodiments, the network device 101 may determine the number of CRC bits based on the number of the information bits to be encoded. For example, 3 CRC bits may be used for 12-48 information bits, while 4 CRC bits may be used for 48-128 information bits. For example, a lookup table about the CRC bit number may be predefined, and the number of CRC bits to be used may be determined based on the lookup table.

In some embodiments, a CRC generating polynomial may be obtained based on the determined number of CRC bits and the extended information bits (for example, including frozen bits). A corresponding CRC generator matrix may be obtained based on the CRC generator polynomial. By multiplying the extended information bits and the CRC generator matrix, input bits appended with the corresponding CRC bits (the input bits described herein refer to the bits to be subjected to the polar encoding) may be obtained. Generation of the CRC bits may be implemented using an existing CRC encoder. Further detailed description will be made with reference to specific examples.

In block 230, the network device 101 distributes the bits of the error detection code in the information bits to be encoded. In some embodiments, the network device 101 may allocate the CRC bits into the information bits by transforming the CRC generator matrix. Description will be made using the specific examples.

Figure 3:
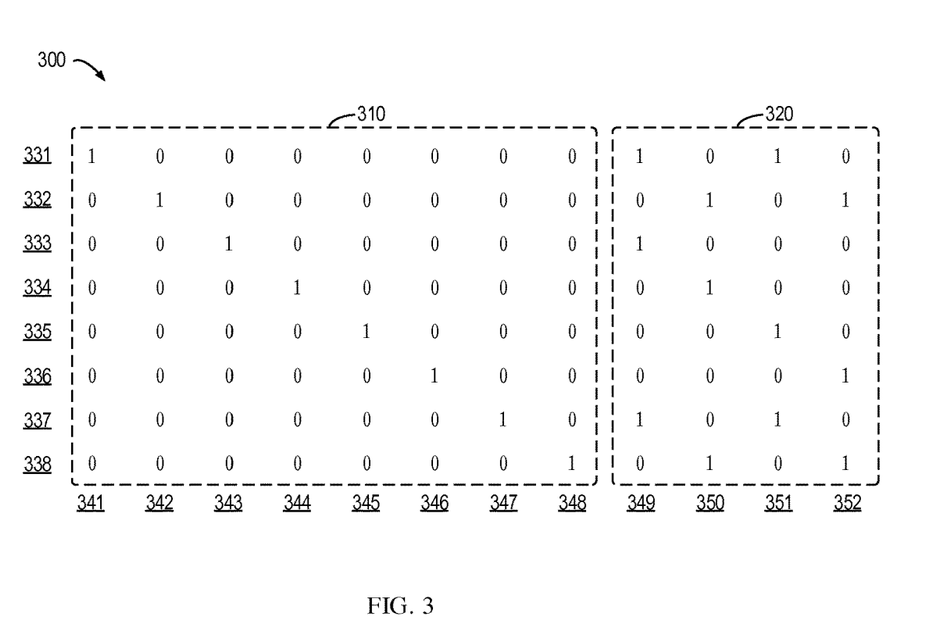
FIG. 3 shows an example of a CRC generator matrix 300 in accordance with embodiments of the present disclosure.

For example, the K information bits are extended into N-P bits by the bit extension. N is a total number of input bits and P is a number of CRC bits. Assume K=4, P=4, and N=12, herein. The obtained CRC generator polynomial is for example [1 0 1 0 1]. FIG. 3 shows a corresponding CRC generator matrix 300 corresponding to the CRC generator polynomial.

As shown in FIG. 3, the matrix 300 includes an information section 310 and a CRC section 320. The information section 310 therein is a unit matrix with 8 rows and 8 columns, which corresponds to extended information bits. The CRC section 320 has 4 columns respectively corresponding to 4 CRC bits.

It can be seen from the CRC section 320 that each CRC bit is a modulo 2 sum of 8 extended information bits. Assuming that the seventh extended information bit is a frozen bit (for example, being configured as 0), a row 337 associated with the frozen bit may be referred to as a frozen row. A column 349 in the matrix 300 corresponds to the first CRC bit which is associated with the first, the third, and the seventh extended information bit. Because the seventh extended information bit is a frozen bit (namely, 0), the first CRC bit is, in fact, only associated with the first and the third extended information bit.

In some embodiments, the column 349 may be swapped with the fourth column 344 in the information section 310, such that the first CRC bit is distributed behind the third information bit. As such, when the polar decoding is performed at a receiving device, after the first information bit, the third information bit, and the first CRC bit are solved, the first CRC bit may be used to check the first information bit and the third information bit, so as to perform a "pruning" operation in a decoding process, thereby improving the decoding performance. Implementation of the example about the pruning operation will be further described in detail below. It would be appreciated that the column 349 is not limited to be swapped with the column 341, and may be inserted at the left side of the column 341 or swapped with the column 342 between the column 341 and the column 343. That is, the first CRC bit may be distributed as adjacent to the information bit associated therewith.

In some embodiments, for the first CRC bit, a non-frozen row containing 1 in the CRC section is searched from the bottom up regarding the column 349 associated therewith, and for example, the row 333 may be obtained. The row 333 and the row 332 may be swapped, such that the CRC section 320 is changed into a similarity of the upper triangular matrix. Therefore, the information bit associated with the first CRC bit can be solved early at the decoding phase.

In some embodiments, the above two types of matric transforming may be combined. For example, the row 333 and the row 332 may be swapped first, and the row 349 is swapped to the position of the row 343. That is, the information bit associated with the first CRC bit can be solved early at the decoding phase, and the first CRC bit is distributed as adjacent to the information bit associated therewith, thereby providing a better error detecting capability while further improving the decoding performance.

In addition or alternatively, in some embodiments, regarding the matrix 300, the frozen row containing 1 in the CRC section is searched from the bottom up. For example, the row 330 may be found. For example, the row 330 and the row 350 may be summed up (for example, modulo 2 sum) to eliminate a number of 1 in the CRC section 320 located in the row 350. That is, the frozen row is used to reduce the number of the information bits associated with the third CRC bit. The operation may be performed iteratively until the number of 1 in the CRC section 320 is reduced to $\log_2 L+t$, where t is a number from $[-1, N]$. In this way, the decoding performance of the polar code can be further improved.

It should be noted that, after the matrix transformation is performed (i.e., the row 330 is added to the row 350), the value is changed to 1 at an intersection of the row 350 with the column 347. That is, the value of the seventh input bit is a sum of the fifth extended information bit and the seventh extended information bit. It is undesirable because the seventh input bit is a frozen bit which is always 0. It would be appreciated that a reverse operation corresponding thereto is required at the receiving device to recover the value at the intersection of the row 350 with the column 347.

In addition or alternatively, in some embodiments, transformations, other than the one as mentioned above, may be performed for the matrix 300, such that the CRC bits are distributed more evenly into the input bits to be encoded.

Besides, the CRC bits may be mapped to the worst sub-channel or the best sub-channel of the polar code, or may be mapped, together with the information bits, in accordance with a decoding order. The scope of the present disclosure is not limited in this aspect.

It should be appreciated that these matrix transformations are performed regarding the output of the block 220 (i.e., the output of the CRC encoder), and it is unnecessary to make any change to the existing CRC encoder.

Returning to FIG. 2, in some embodiments, in the block 240, the information bits together with the error detection code distributed therein are polar-encoded. In some embodiments, in presence of bit extension, the information bits and the frozen bits together with the error detection code distributed therein are polar-encoded. Any polar encoder known or to be developed in the future may be used for performing the coding operation.

It can be seen from the foregoing description that, though the embodiments of the present disclosure can improve the polar decoding performance, reduce FAR, and provide a better error detecting capability, it is unnecessary to make any change to the existing CRC encoder and/or polar encoder. Therefore, there is a low implementation complexity of the embodiments of the present disclosure.

It would be appreciated that the order of steps of the method 200 may be different than the order of steps as shown in FIG. 2. For example, the error check code generator matrix may be first transformed to distribute bits of the error check code into the information bits to be encoded, and the error check code is then generated using the transformed generator matrix. That is, the block 230 may be performed prior to the block 220.

Figure 4:
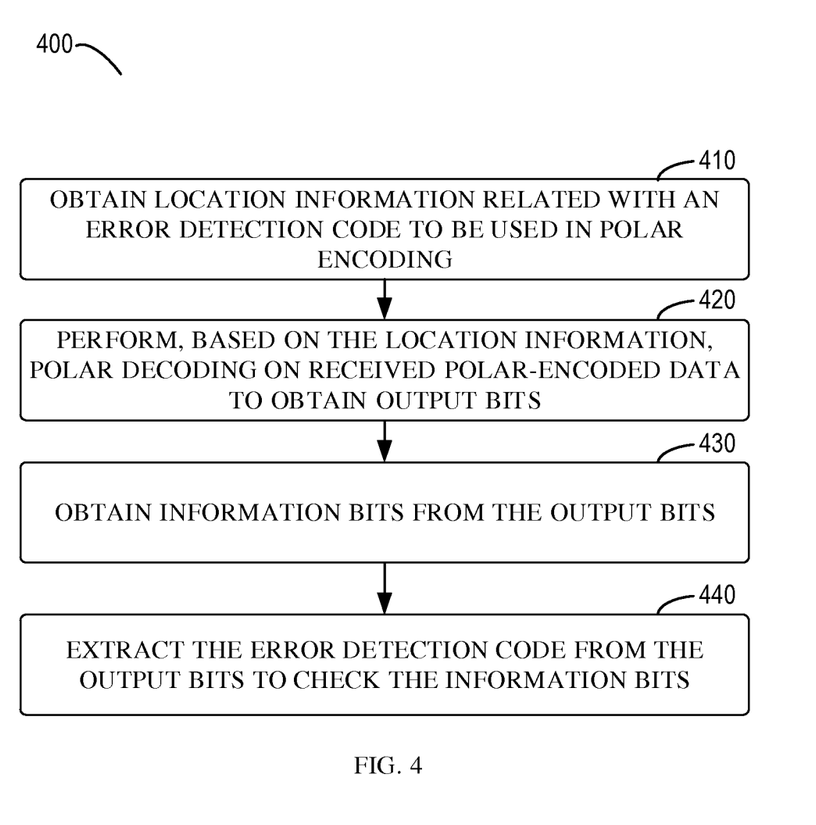
FIG. 4 is a flowchart of a method 400 implemented at a communication device acting as a receiving apparatus in accordance with embodiments of the present disclosure.

FIG. 4 is a flowchart illustrating a method 400 in accordance with the embodiments of the present disclosure. The method 400 is implemented at a communication device acting as the receiving device in the communication network 100. For example, the communication device may be the terminal device UE 111 or 112, or the network device 101 in FIG. 1. For ease of description, the method 400 will be described with reference to UE 111 of FIG. 1. It would be appreciated that the method 400 may further include additional steps not shown and/or may skip over steps as shown, and the scope of the present disclosure is not limited in this aspect.

As shown in FIG. 4, location information related with an error detection code used in the polar code is obtained in a block 410. In some embodiments, UE 111 may acquire a generator matrix corresponding to the error detection code (e.g. CRC code), and the location information is then obtained based on the generator matrix. For example, the generator matrix corresponding to the CRC code may be agreed by receiving and transmitting parties in advance.

Figure 5:
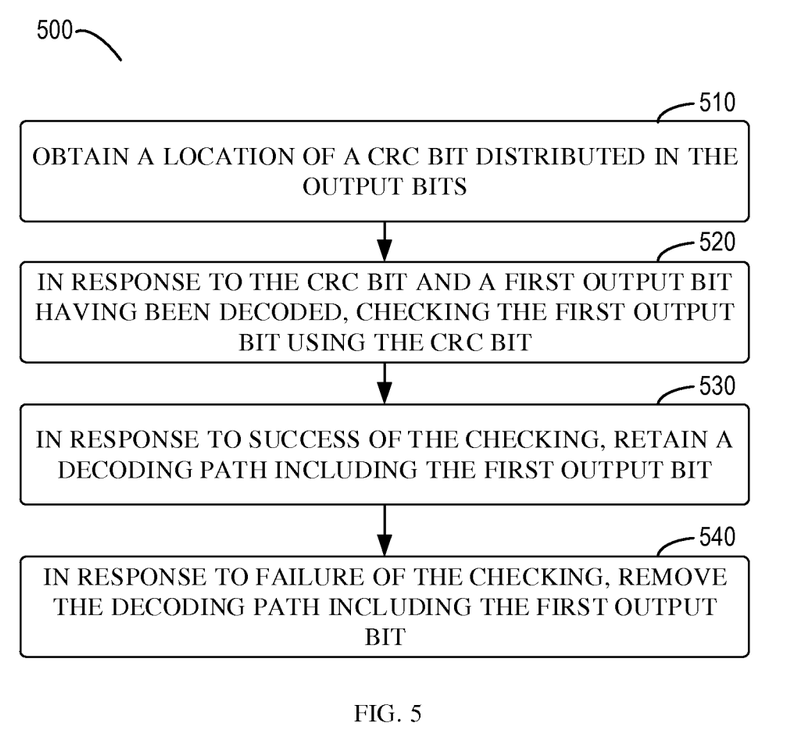
FIG. 5 is a flowchart of a method 500 of a pruning operation in a polar decoding process in accordance with embodiments of the present disclosure.

In a block 420, UE 111 performs polar decoding on the received polar-encoded data based on the location information, so as to obtain output bits. In some embodiments, for example, in the CRC-aided list decoding solution, UE 111 may perform the pruning operation in decoding process using the location information. In this regard, FIG. 5 is a flowchart illustrating a method 500 of a pruning operation in the polar decoding process. It would be appreciated that the method may further include additional steps not shown and/or may skip over steps as shown, and the scope of the present disclosure is not limited in the aspect.

In a block 510, UE 111 may obtain the location of the CRC bit distributed in the output bits based on the generator matrix. For example, the CRC bit may be associated with a first output bit in the output bits. In a block 520, in response to the CRC bit and the first output bit having been decoded, UE 111 may check the first output bit using the CRC bit. In response to success of the checking, a decoding path including the first output bit is retained in a block 530. In response to failure of the checking, the decoding path including the first output bit may be removed, for example in a case that the number of the decoding paths currently retained has reached a size of the used list, in a block 540.

In some embodiments, besides "hard decision" as shown in blocks 530 and 540, the pruning operation may use the manner of "soft decision." For example, after performing the block 520, when the checking fails, the decoding path including the first output bit is not directly removed, but for example a metric value (also referred to as "a punishment value") is allocated to the decoding path. As such, the decoding path can be removed only when the punishment value is greater than a predetermined threshold.

By the above pruning operation, the polar decoding performance can be improved, because it reduces a number of candidate paths such that a probability to correctly select a decoding path is increased.

Alternatively, in some embodiments, besides the above early pruning operation performed in the decoding process, the punning operation may be performed when all the candidate decoding paths have been determined. For example, at UE 111, the paths passing the CRC check or the paths of low punishment values may be retained from all the candidate paths. In some other embodiments, it may be determined firstly whether the number of the decoding paths retained currently exceeds a predetermined threshold, and the pruning operation is performed when the number of decoding paths exceeds the predetermined threshold, thereby avoiding a high FAR.

Besides, in some embodiments, the pruning may be performed not only using a single CRC bit. For example, the pruning operation may be performed using a combination of several CRC bits (i.e., a component of the CRC generator matrix), so as to further improve the decoding performance.

Still referring to FIG. 4, in a block 430, UE 111 acquires the information bits from the output bits. For example, UE 111 may perform an inverse transformation on the CRC generator matrix to acquire the information bits from the output bits. The process of the inverse transformation corresponds to the process related with the description of the block 230 in FIG. 2, and further detailed description will be omitted herein.

In a block 440, UE 111 extracts the error detection code included in the output bits, so as to check the information bits. For example, the block 440 may be completed using the existing CRC decoder. That is, it is unnecessary to make any change to the existing CRC decoder in the embodiments of the present disclosure.

Figure 6:
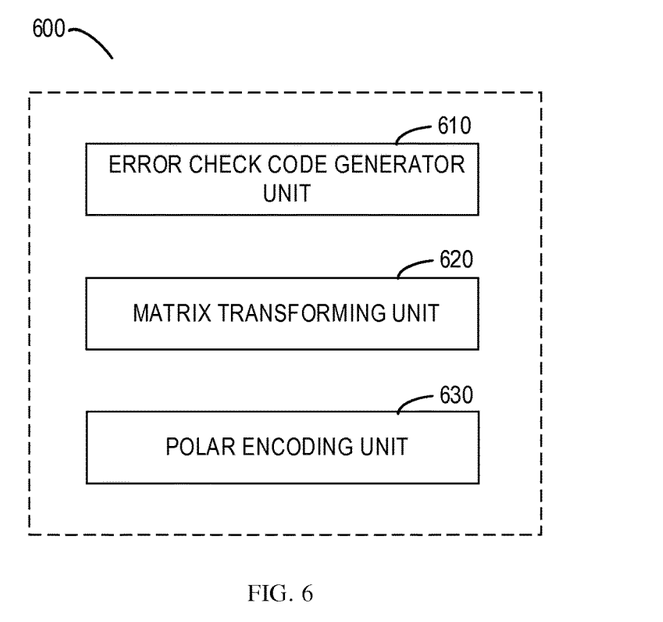
FIG. 6 is a block diagram of an apparatus 600 implemented at a communication device acting as a transmitting device in accordance with embodiments of the present disclosure.

FIG. 6 is a block diagram showing an apparatus 600 in accordance with certain embodiments of the present disclosure. The apparatus 600 may be implemented at a communication device acting as the transmitting device, for example at the terminal device 111 or 112 side or at the network device 101 as shown in FIG. 1. The apparatus 600 may be a software module based system, or may be a hardware component such as a transmitter or the like. Especially, in some embodiments, the apparatus 600 may be considered as an example implementation of the transmitting device itself.

As shown in FIG. 6, the apparatus 600 may include: an error detection code generating unit 610 configured to generate, based on a desired performance, the error detection code to be used; a matrix transforming unit 620 configured to distribute bits in the error detection code in information bits to be coded; and a polar encoding unit 630 configured to perform polar encoding information bits together with the error detection code distributed in the information bits.

In some embodiments, the error detection code includes any one of CRC code, BCH code, Hamming code, and Gray code.

In some embodiments, the error detection code generating unit 610 is further configured to acquire a generator matrix corresponding to the error detection code; and to generate, based on the generator matrix, error check code.

In some embodiments, the matrix transforming means 620 is further configured to distribute, by transforming the generator matrix, bits of the error check code into the information bits.

In some embodiments, the error check code includes a first error detection bit which is associated with a first information bit in the information bits, and the matrix transforming unit 620 is further configured to transform at least one of a row and a column associated with the first error detection bit, and to distribute the first error detection bit as adjacent to the first information bit.

In some embodiments, the apparatus 600 may further include a bit extending unit configured to bit extend the information bits to add frozen bits for polar encoding.

In some embodiments, the matrix transforming unit 620 is further configured to reduce a number of information bits associated with bits in the error detection code by transforming rows associated with the frozen bits in a generator matrix.

In some embodiments, the polar encoding unit 630 is further configured to perform polar encoding on the information bits, the frozen bits, and the error detection code.

Figure 7:
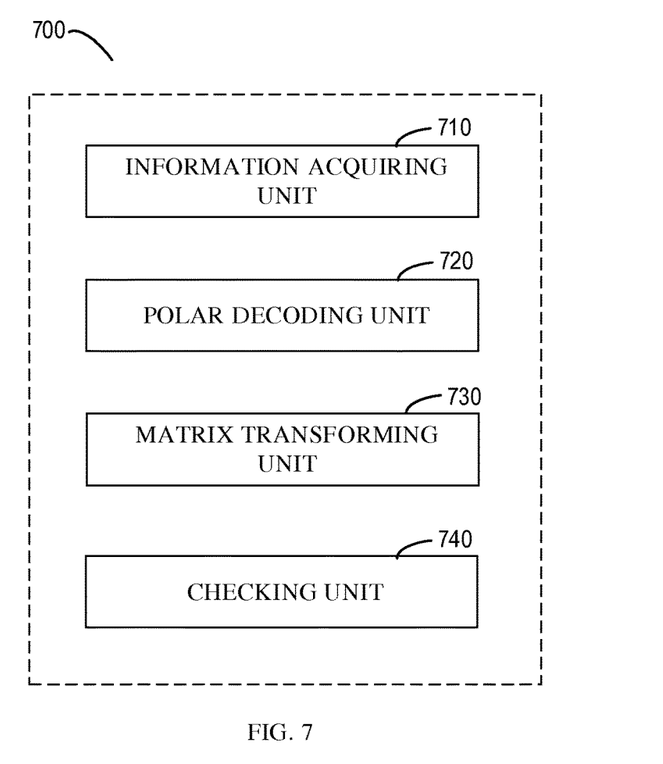
FIG. 7 is a block diagram of an apparatus 700 implemented at a communication device acting as a receiving device in accordance with embodiments of the present disclosure.

FIG. 7 is a block diagram illustrating an apparatus 700 in accordance with certain embodiments of the present disclosure. The apparatus 700 may be implemented at a communication device acting as a receiving device, for example at the terminal device 111 or 112 side or the network device 101 as shown in FIG. 1. The apparatus 700 may be a software-based system, or may be a hardware assembly such as a receiver or the like. Particularly, in some embodiments, the apparatus 700 may be considered as an example implementation of the receiving device itself.

As shown in FIG. 7, the apparatus 700 may include: an information acquiring unit 70 configured to acquire location information related with error detection code used in polar coding; a polar decoding unit 720 is configured to perform, based on the location information, polar decoding on received polar-encoded data to obtain output bits; a matrix transforming unit 730 configured to obtain information bits from the output bits; and a check unit 740 configured to extract error check code included in the output bits, to check the information bits.

In some embodiments, the error detection code includes any one of CRC code, BCH code, Hamming code, and Gray code.

The information acquiring unit 710 is further configured to acquire a generator matrix corresponding to the error detection code; and to obtain location information based on the generator matrix.

In some embodiments, polar decoding uses a list-based polar decoding process, the error detection code includes a first error detection bit, and the polar decoding unit 720 is further configured to obtain, based on location information, a location of the first error detection bit distributed in the output bits, the first error detection bit being associated with a first output bit in the output bits; and in response to the first error detection bit and the first output bit being decoded, the first output bit is checked using the first error detection bit.

In some embodiments, the polar decoding unit 720 is further configured to, in response to success of the checking, retain a decoding path including the first output bit; and in response to failure of the checking, remove the decoding path including the first output bit.

In some embodiments, the polar decoding unit 720 is configured to, in response to failure of the checking, allocate a metric value to the decoding path including the first output bit; determine whether the metric value exceeds a second threshold; and in response to the metric value exceeding the second threshold, remove the decoding path including the first output bit.

In some embodiments, the polar decoding unit 720 is further configured to determine whether a number of decoding paths currently retained exceeds a first threshold; and in response to the number of decoding paths exceeding the first threshold, check the first output bit using a first error detection bit.

In some embodiments, the matrix transforming unit 730 is further configured to obtain information bits from the output bits by inversely transforming the generator matrix.

For clarity, some optional units of apparatuses 600 and 700 are not shown in FIGS. 6 and 7. However, it would be appreciated that each feature as depicted with reference to FIGS. 1-3 is applicable to the apparatus 600; and each feature as depicted with reference to FIG. 1 and FIGS. 4-5 is likewise applicable to the apparatus 700. Besides, each unit of the apparatus 600 and/or 700 may be a hardware module, or may be a software module. For example, in certain embodiments, the apparatus 700 may be partially or entirely implemented using software and/or firmware, for example implemented as a computer program product included on a computer readable medium. Alternatively or in addition, the apparatus 600 and/or 700 may be partially or entirely implemented based on hardware, for example implemented as an Integrated Circuit (IC), an Application-specific Integrated Circuit (ASIC), a System-on-a-chip systems (SOC), a Field-programmable Gate Array (FPGA), and the like. The scope of the present disclosure is not limited in the regard.

Figure 8:
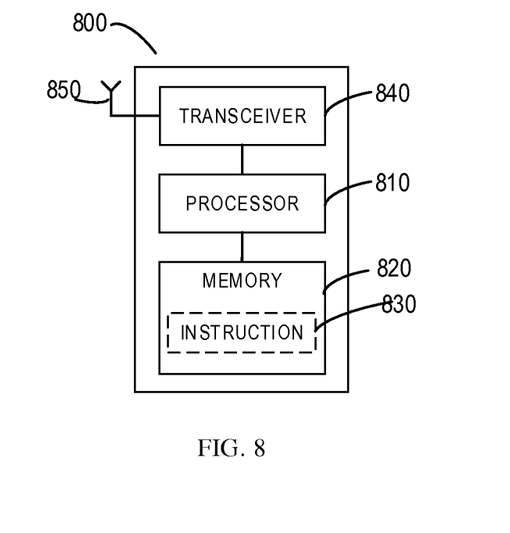
FIG. 8 is a block diagram of a communication device 800 in accordance with embodiments of the present disclosure.

FIG. 8 is a block diagram illustrating a communication device 800 suitable for implementing embodiments of the present disclosure. The device 800 may be used to implement the transmitting device or the receiving device in the embodiments of the present disclosure, for example the network device 101 or terminal device as shown in FIG. 1, or the first terminal device 111 or 112 as shown in FIG. 1.

As shown in the example of FIG. 8, the device 800 includes a processor 810. The processor 810 controls operations and functionality of the device 800. For example, in certain embodiments, the processor 810 may perform various operations by means of instructions 830 stored in a memory 820 coupled thereto. The memory 820 may be of any appropriate type applicable to a local technical environment, and may be implemented using any appropriate data storage technique, including but not limited to, a semiconductor-based storage device, a magnetic storage device and system, an optical storage device and system. Though FIG. 8 only shows a memory unit, the device 800 may include multiple physically different memory units.

The processor 810 may be of any appropriate type applicable to a local technical environment, and may include, but not limited to, one or more of general purpose computers, special purpose computers, microprocessors, digital signal processors (DSPs) and processors based on multicore processor architecture. The device 800 may further include multiple processors 810. The processor 810 may be coupled to a transceiver 840 which may implement transmitting and receiving of information with aid of one or more antennae 850 and/or other components.

According to embodiments of the present disclosure, the processor 810 and the memory 820 may be operated in cooperation, to implement the methods 200, 400, and/or 500 as described with reference to FIGS. 2-5. Specifically, if the communication device 800 acts as a transmitting device, the communication device 800 may be used to perform the method 200 when the instructions 830 in the memory 820 are executed by the processor 810. If the communication device 800 acts as a receiving device, the communication device 800 may be caused to perform the method 400 and/or 500 when the instructions 830 in the memory 820 are executed by the processor 810. It would be appreciated that all features as described above are all applicable to the device 800, which are omitted herein.

Generally, various embodiments of the present disclosure may be implemented in hardware or special purpose circuits, software, logic or any combination thereof. Some aspects may be implemented in hardware, while other aspects may be implemented in firmware or software which may be executed by a controller, a microprocessor or another computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

As examples, the embodiments of the present disclosure may be described in the context of the machine executable instruction which for example includes program modules executed in the device on a real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor of a general purpose computer, special purpose computer, or other programmable data processing apparatus, such that the program codes, when executed by a computer or other programmable data processing devices, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

In context of the present disclosure, the machine readable medium may be any tangible medium that may contain, or store a program for use by or in connection with an instruction execution system, apparatus, or device. The machine readable medium may be a machine readable signal medium or a machine readable storage medium. A machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a specific order, this should not be understood as requiring that such operations be performed in the specific order shown or in sequential order, or that all illustrated operations be performed, to achieve desirable results. In certain circumstances, multitasking and parallel processing may be advantageous. Likewise, while several specific embodiment details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms for implementing the claims.

I claim:

1. A method of data processing in a communication system, comprising:
   generating, based on an intended performance, an error detection code to be used;
   distributing bits of the error detection code in information bits to be encoded; and
   performing polar encoding on the information bits together with the error detection code distributed in the information bits,
   wherein generating the error detection code to be used comprises acquiring a generator matrix corresponding to the error detection code and generating the error detection code based on the generator matrix,
   wherein location information related with the error detection code used in the polar code is obtained based on the generator matrix, wherein the generator matrix is agreed by receiving and transmitting parties in advance,
   wherein distributing the bits of the error detection code in the information bits to be encoded comprises distributing the bits of the error detection code in the information bits by transforming the generator matrix.

2. The method according to claim 1, wherein the error detection code comprises a first error detection bit, the first error detection bit being associated with a first information bit in the information bits, and wherein distributing the bits of the error detection code in the information bits to be encoded comprises: distributing the first error detection bit to be adjacent to the first information bit by transforming at least one of a row and a column associated with the first error detection bit in the generator matrix.

3. The method according to claim 1, further comprising: adding frozen bits used for the polar encoding by performing bit extending on the information bits.

4. The method according to claim 3, wherein distributing the bits of the error detection code in the information bits to be encoded comprises:
   reducing the number of information bits associated with the bits of the error detecting code by transforming a row associated with the frozen bits in the generator matrix.

5. The method according to claim 3, wherein performing the polar encoding on the information bits together with the error detection code distributed in the information bits comprises:
   performing the polar encoding on the information bits, the frozen bits and the error detection code.

6. A method of data processing in a communication system, comprising:
   obtaining location information related with an error detection code to be used in polar encoding;
   performing, based on the location information, the polar decoding on received polar-encoded data to obtain output bits;
   obtaining information bits from the output bits; and
   extracting the error detection code from the output bits to check the information bits.

7. The method according to claim 6, wherein obtaining the location information related with the error detection code to be used in the polar encoding comprises:
   acquiring a generator matrix corresponding to the error detection code; and
   obtaining the location information based on the generator matrix.

8. The method according to claim 6, wherein the polar decoding uses a list-based polar decoding process, the error detection code comprises a first error detection bit, and
   wherein performing the polar decoding on the received polar-encoded data comprises:
   obtaining, based on the location information, a location of the first error detection bit distributed in the output bits, the first error detection bit being associated with a first output bit in the output bits; and
   in response to the first error detection bit and the first output bit having been decoded, checking the first output bit using the first error detection bit.

9. The method according to claim 8, further comprising:
   in response to success of the checking, retaining a decoding path including the first output bit; and
   in response to failure of the checking, removing the decoding path including the first output bit.

10. The method according to claim 8, wherein checking the first output bit using the first error detection bit comprises:
    determining whether the number of decoding paths currently retained exceeds a first threshold; and
    in response to the number of decoding paths exceeding the first threshold, checking the first output bit using the first error detection bit.

11. The method according to claim 8, further comprising:
    in response to failure of the checking, allocating a metric value to a decoding path including the first output bit;
    determining whether the metric value exceeds a second threshold;
    in response to the metric value exceeding the second threshold, removing the decoding path including the first output bit.

12. A communication device, comprising:
    a processor; and
    a memory storing instructions, the instructions, when executed by the processor, causing the communication device to:
    generate, based on an intended performance, an error detection code to be used;
    distribute bits of the error detection code in information bits to be encoded; and
    perform polar encoding on the information bits together with the error detection code distributed in the information bits,
    wherein generating the error detection code to be used comprises acquiring a generator matrix corresponding to the error detection code and generating the error detection code based on the generator matrix,
    wherein location information related with the error detection code used in the polar code is obtained based on the generator matrix, wherein the generator matrix is agreed by the receiving and transmitting parties in advance,
    wherein distributing the bits of the error detection code in the information bits to be encoded comprises distributing the bits of the error detection code in the information bits by transforming the generator matrix.

13. A communication device, comprising:
    a processor; and
    a memory storing instructions, the instructions, when executed by the processor, causing the communication device to:
    obtain location information related with an error detection code to be used in polar encoding;

perform, based on the location information, the polar decoding on received polar-encoded data to obtain output bits;
obtain information bits from the output bits; and
extract the error detection code from the output bits to check the information bits.

\* \* \* \* \*